United States Patent
Moriyama et al.

(10) Patent No.: US 7,189,466 B2
(45) Date of Patent: Mar. 13, 2007

(54) ORGANIC LIGHT-EMITTING ELEMENT AND DISPLAY DEVICE

(75) Inventors: Takashi Moriyama, Kanagawa (JP); Shinjiro Okada, Kanagawa (JP); Akira Tsuboyama, Kanagawa (JP); Takao Takiguchi, Tokyo (JP); Seishi Miura, Kanagawa (JP); Satoshi Igawa, Kanagawa (JP); Jun Kamatani, Kanagawa (JP); Hironobu Iwawaki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 226 days.

(21) Appl. No.: 10/477,104

(22) PCT Filed: May 21, 2003

(86) PCT No.: PCT/JP03/06327

§ 371 (c)(1),
(2), (4) Date: Nov. 10, 2003

(87) PCT Pub. No.: WO03/103341

PCT Pub. Date: Dec. 11, 2003

(65) Prior Publication Data

US 2004/0169461 A1 Sep. 2, 2004

(30) Foreign Application Priority Data

Jun. 4, 2002 (JP) ............................. 2002-162343

(51) Int. Cl.
*H01L 51/50* (2006.01)
*H05B 33/14* (2006.01)

(52) U.S. Cl. ....................... 428/690; 428/917; 313/503; 313/506

(58) Field of Classification Search ................ 428/690, 428/917; 313/503, 506
See application file for complete search history.

(56) References Cited

U.S. PATENT DOCUMENTS 5,683,823 A 11/1997 Shi et al. ..................... 428/690

(Continued)

FOREIGN PATENT DOCUMENTS

EP 0 786 925 7/1997

(Continued)

OTHER PUBLICATIONS

Yuichiro Kawamura, "Energy Transfer in Polymer Electrophosphorescent Light Emitting Devices with Single and Multiple Doped Luminescent Layers", *Journal of Applied Physics*, vol. 92, No. 1, Jul. 1, 2002, pp. 87-93.

(Continued)

*Primary Examiner*—Dawn L. Garrett
(74) *Attorney, Agent, or Firm*—Fitzpatrick, Cella, Harper & Scinto

(57) ABSTRACT

There is provided an organic light-emitting element comprising at least one light-emitting layer between a pair of electrodes formed on a substrate and at least two or more light emission center materials included in the light-emitting layer, and that the at least one or more light emission center materials include a phosphorescent light-emitting material, and an excitation lifetime of the light emission center material that emits light having a shortest wavelength is shorter than an excitation lifetime of the other light emission center material, whereby a high-efficiency organic light-emitting element without decreasing a color purity of white light emission can be obtained.

3 Claims, 4 Drawing Sheets

U.S. PATENT DOCUMENTS

| | | | |
|---|---|---|---|
| 5,698,858 A | 12/1997 | Borner | 250/484.2 |
| 6,303,238 B1 | 10/2001 | Thompson et al. | 428/690 |
| 6,699,597 B2 * | 3/2004 | Bellmann et al. | 428/690 |
| 2001/0053462 A1 | 12/2001 | Mishima | 428/690 |
| 2002/0146589 A1 | 10/2002 | Akiyama et al. | 428/690 |
| 2002/0197511 A1 | 12/2002 | D'Andrade et al. | 428/690 |
| 2003/0068526 A1 * | 4/2003 | Kamatani et al. | 428/690 |
| 2003/0087125 A1 * | 5/2003 | Aziz et al. | 428/690 |
| 2003/0141809 A1 | 7/2003 | Furugori et al. | 313/504 |
| 2003/0141810 A1 * | 7/2003 | Kobayashi et al. | 313/504 |
| 2003/0186078 A1 * | 10/2003 | Murata et al. | 428/690 |
| 2003/0186080 A1 | 10/2003 | Kamatani et al. | 428/690 |
| 2003/0189216 A1 | 10/2003 | Kamatani et al. | 257/98 |
| 2003/0224208 A1 | 12/2003 | Kamatani et al. | 428/690 |
| 2005/0048319 A1 * | 3/2005 | Oshiyama et al. | 428/690 |

FOREIGN PATENT DOCUMENTS

| | | |
|---|---|---|
| JP | 8-319482 | 12/1996 |
| JP | 9-208946 | 8/1997 |
| JP | 11-256148 | 9/1999 |
| JP | 11-329739 | 11/1999 |
| JP | 2001-319780 | 11/2001 |
| JP | 2002-50483 | 2/2002 |
| JP | 2002-260858 | 9/2002 |
| JP | 2003-64355 | 3/2003 |
| JP | 2003/086376 | 3/2003 |
| WO | 01/91203 | 11/2001 |
| WO | WO 02/091814 | 11/2002 |

OTHER PUBLICATIONS

J. Kido, et al., "Single-Layer White Light-Emitting Organic Electroluminescent Devices Based on Dye-Dispersed Poly(N-vinylcarbazole)", Appl. Phys. Lett., vol. 67, No. 16, pp. 2281-2283 (1995).

P.S. Vincett, et al., "Electrical Conduction and Low Voltage Blue Electroluminescence in Vacuum-Deposited Organic Films", Thin Solid Films, vol. 94, pp. 171-183 (1982).

M.A. Baldo, et al., "Very High-Efficiency Green Organic Light-Emitting Devices Based on Electrophosphorescence", Appl. Phys. Lett., vol. 75, No. 1, pp. 4-6 (1999).

D.F. O'Brien, et al., "Improved Energy Transfer in Electrophosphorescent Devices", Appl. Phys. Lett., vol. 74, No. 3, pp. 442-444 (1999).

Z. Xu, et al, "Cation Dynamics and Diffusion in Lithium Orthosilicate: Two Dimensional Lithium-6 NMR", Science, vol. 270, pp. 1332-1334 (1995).

Adachi et al., "High-efficiency organic . . . electron-transporting materials", Appl. Phys. Lett., vol. 77, No. 6, 904-906 (2000).

"Organic EL Material and Display", Apr. 20, 2001, pp. 251-252.

Yang et al., "Use of Poly(9-vinylcarbazole) . . . Light-Emitting Devices", Japan Journal of Applied Physics, vol. 39, Part 2, No. 8A, L828-L829, 2000.

* cited by examiner

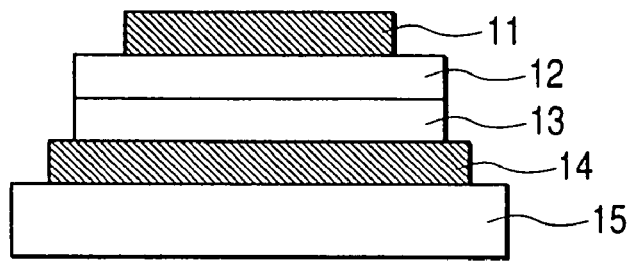
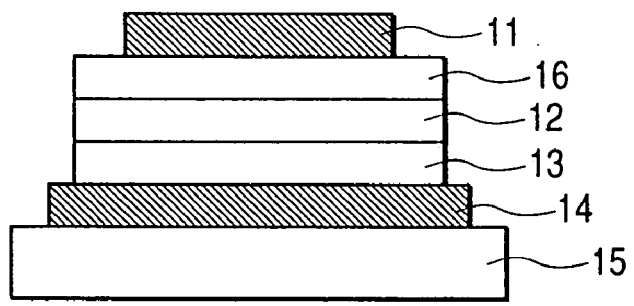
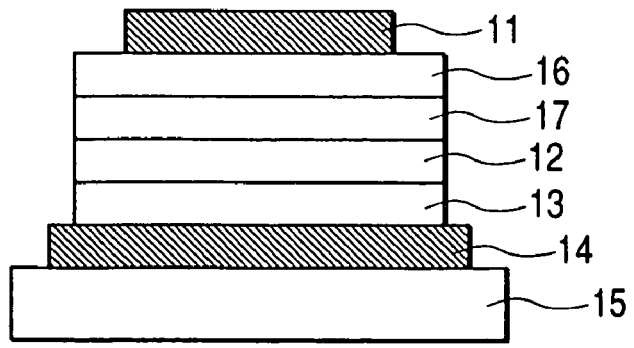

ORGANIC LIGHT-EMITTING ELEMENT AND DISPLAY DEVICE

TECHNICAL FIELD

The present invention relates to an organic light-emitting element (also referred to as an organic electroluminescence element or an organic EL element) to be used in a light source or a display device such as a display, in particular, an improvement in color purity of the organic light-emitting element.

BACKGROUND ART

Currently, liquid crystal elements are components most extensively used in flat panel displays which are space-saving man-machine interfaces. Particularly, a liquid crystal element of a so-called active matrix type (e.g., TFT system), in which an active element (switching element) such as a transistor is arranged for each of pixels, becomes the mainstream of the flat display panel.

Recently, on the other hand, attention is being given to self-luminous devices provided for flat panels. The self-luminous devices include plasma light-emitting elements, field emission elements, electroluminescence elements, and so on.

Among them, the electroluminescence elements (hereinafter, referred to as "EL elements") are broadly divided into inorganic EL elements and organic EL elements. The inorganic EL element is an AC-driven thin-film EL element using an inorganic semiconductor, and an inorganic material such as ZnS is mainly used therein.

Regarding the organic EL element, there is an example in old times, in which light is emitted by applying voltage onto an anthracene-deposited film (Thin Solid Films, 94 (1982) 171), or the like. However, an opportunity of extensively attracting attention as a light-emitting device was that C. W. Tang et al. demonstrated that high-luminance light emission can be achieved with DC drive using a laminated structure of thin films of a diamine-based molecule and a fluorescence metal chelate complex. In recent years, applied researches for making the organic EL element into a device as a light-emitting element that affords a high-speed response and a high efficiency, including material developments have been vigorously conducted in terms of advantages of easiness in making a large area, desired coloring which is obtainable by the developments of various kinds of new materials, capability of being driven at low voltage, and so on as compared with the inorganic EL element.

The organic EL element is a carrier-injection self-luminous device utilizing luminescence generated when an electron and a hole which arrive at a light-emitting layer are recombined together. In FIGS. 1A to 1C, a cross-sectional configuration of a typical organic EL element is schematically illustrated. In FIG. 1A, reference numeral 11 denotes a metal electrode, 12 denotes a light-emitting layer, 13 denotes a hole-transporting layer, 14 denotes a transparent electrode, and 15 denotes a transparent substrate. In FIG. 1B, reference numeral 16 denotes an electron-transporting layer. In FIG. 1C, reference numeral 17 denotes an exciton dispersion barrier layer. In FIGS. 1B and 1C, furthermore, the same reference numerals as those of FIG. 1A represent the same structural components, respectively.

As the light-emitting layer 12 of FIG. 1A, an aluminum-quinolinol complex having electron-transporting properties and light-emitting properties, typically Alq3 represented by the following formula (1) or the like, is used. In addition, as the hole-transporting layer 13, an electron-donative material such as a triphenyl diamine derivative, typically α-NPD represented by formula (1) or the like, is used. Furthermore, as shown in FIG. 1B, an organic compound layer composed of three layers of the electron-transporting layer 16, the light-emitting layer 12, and the hole-transporting layer 13 is often used.

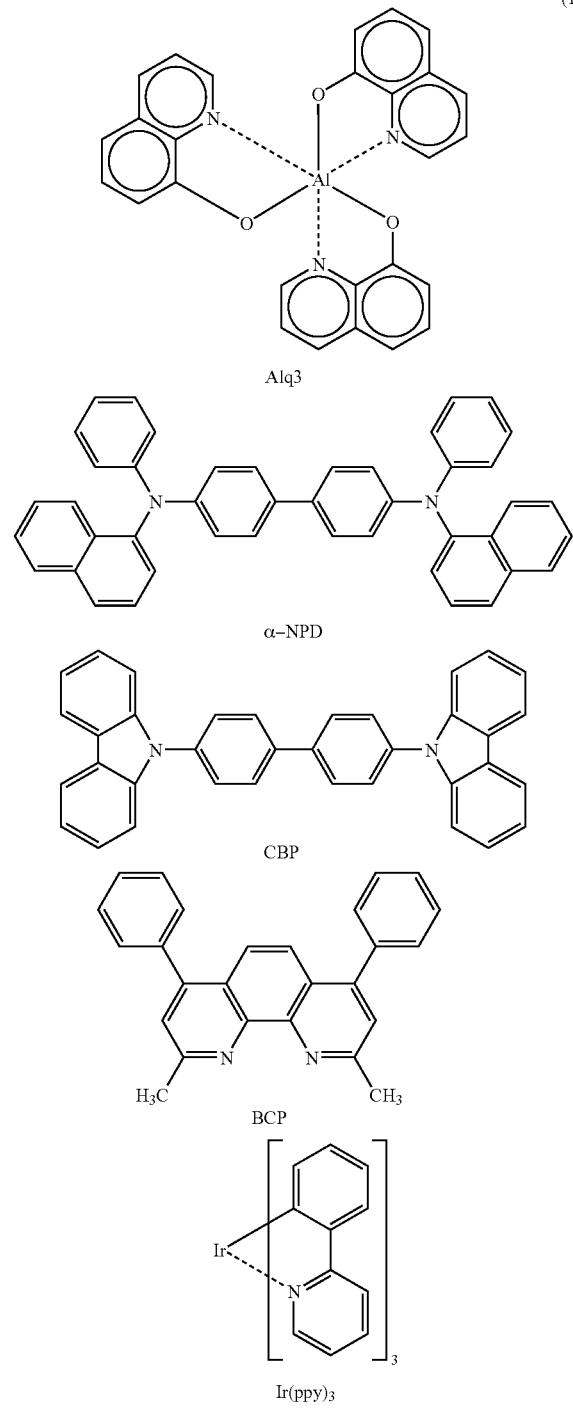

(1)

Alq3

α-NPD

CBP

BCP

Ir(ppy)₃

Furthermore, the light-emitting layer may be made of a single material. In many cases, however, pigment doping by which a pigment material having a high light emission efficiency is doped in a host material is often used.

In the configurations of FIGS. 1A to 1C, the metal electrode 11 is used as a cathode and the transparent electrode 14 is used as an anode for taking out emitted light, and the organic compound layer is sandwiched between both electrodes. In general, each layer of the organic compound layer has a film thickness of about several tens of nm. As a metal material of the cathode, a metal having a small work function, such as aluminum, aluminum-lithium alloy, or magnesium-silver alloy. In addition, a conductive material having a large work function is used as an anode, such as indium tin oxide (ITO).

The organic EL element is capable of emitting three primary colors of red, green, and blue, and so on in a self-luminous manner by appropriately selecting materials that constitute the light-emitting layer, so that it is possible to constitute a full-color display device. In addition, it has excellent characteristics of a high-speed response and a wide-viewing angle with respect to a liquid crystal display, so that it is expected as a next-generation flat panel.

There are two representative methods as a process for realizing a full-color display device using an organic EL element.

One of them is a patterning method through a vacuum vapor deposition method using a shadow mask, which is considered in a monomer material and the other of them is a patterning method through an inkjet method which is considered in a polymer material.

In the monomer material, a method of obtaining an organic thin film using a vacuum vapor deposition method is a technique most popularly used. However, for realizing a RGB full-color panel with high definition patterning, a process for filling with different colors by means of a shadow mask is a process having a high difficulty even though it is not difficult to fill roughly divided areas of several kinds of light-emitting layers with different colors. On the other hand, in the case of the inkjet method in the polymer material, it is difficult to keep the uniformity of the polymer thin films, so that it is said that it still needs considerable time to realize a practical RGB full-color display device.

Under such circumstances, attention is focused on white-light-emitting organic EL element. The white-light-emitting organic EL element has a much broader range of applications, such as a white light source, interior illumination, a flat backlight source for a liquid crystal display, and a monochrome display. A combination of a color filter technology, which achieves an actual accomplishment in the liquid crystal display and a white-light-emitting organic EL element, simply realizes a full-color display device at low cost without filling the RGB-light-emitting layers with different colors in a complicated manner as described above.

Presently, a pigment material by which white light emission having sufficient characteristics can be obtained has not been realized by a single light-emitting material. Therefore, for realizing a white-light-emitting organic EL element, there is a need of mixing three primary colors of RGB, or blue and a complementary color of yellow, so that various systems have been considered. Among them, as a method of mixing three colors of RGB, the following two types can be considered:

(1) a single light-emitting layer type, where each pigment of RGB is doped into a single light-emitting layer; and
(2) a RGB laminated layer type, where light-emitting layers of RBG are laminated. Regarding (1), there are documents, such as Applied Physics Letter (Appl. phys. Lett. vol 67, 2281 (1995)). Regarding (2), there are documents, such as Science (Science vol 1267, 1332 (1995)). The single light-emitting layer type is the simple one as the light-emitting layer can be formed of a single layer. In the case of the RGB laminated layer type, it is comparatively easy to realize the optimization with the doping concentration in each layer and each film thickness.

As described above, the present development of organic EL element has progressed in a wide range. Considering wide-ranging applications, how to increase the light emission efficiency becomes important. For increasing the efficiency of the organic EL element, extensive attention has been focused on a phosphorescent (triplet) light-emitting material in recent years.

In the organic EL element, holes and electrons injected from the electrode come to excitation states by recombining with each other in the light-emitting layer (hereinafter, this kind of chemical species is referred to as exciton). The light is emitted in the process of causing transition to base state. In this process, there are a singlet excitation state and a triplet excitation state in the excitation states, and the transition from the former to the base state is referred to as fluorescence, and the transition from the latter is referred to as phosphorescence. The substances under these states are referred to as singlet exciton and triplet exciton, respectively.

In most of the organic EL elements which have been studied until now, fluorescence at the time of transition from the single exciton to the base state is used. In recent years, on the other hand, elements that actively utilize phosphorescence emission through the triplet exciton have been studied.

Representative documents that have been published are as follows.

Document 1: Improved energy transfer in electrophosphorescent device (D. F. O'Brien et al., Applied Physics Letters Vol 74, No 3 p 422(1999))

Document 2: Very high-efficiency green organic light-emitting elements based on electrophosphorescence (M. A. Baldo et al., Applied Physics Letters Vol 75, No 1 p 4(1999))

In these documents, there is mainly used a configuration in which four layers are laminated as the organic compound layer which is sandwiched between electrodes. The materials to be used are a carrier transporting material represented by the above formula (1) and a phosphorescence light-emitting material.

An abbreviation of each material in the formula (1) is as follows.

Alq3: Aluminum-quinolinol complex,
α-NPD: N4,N4'-Di-naphthalen-1-yl-N4, N4'-diphenyl-biphenyl-4,4'-diamine,
CBP: 4,4'-N,N'-dicarbazole-biphenyl,
BCP: 2,9-dimethyl-4,7-diphenyl-1,10-phenanthroline,
PtOEP: Platinum-octaethyl porphyrin complex, and
Ir(ppy)$_3$: Iridium-phenyl pyrimidine complex.

In each of Documents 1 and 2, an element that obtained a high efficiency was of the configuration of FIG. 1C and was an element prepared by dispersing and mixing about 6% of platinum-octaethyl porphyrin complex (PtOEP) or iridium-phenyl pyrimidine complex (Ir(ppy)$_3$), which is a phosphorescent light-emitting material, in host materials of α-NPD as the hole-transporting layer 13, Alq3 as the electron-transporting layer 16, BCP as the exciton dispersion barrier layer 17, and CBP as the light-emitting layer 12.

The organic light-emitting element using a phosphorescent light-emitting material can be principally expected to be become high efficient for the following reasons. Excitons generated by a carrier recombination of holes and electrons include singlet excitons and triplet excitons with a ratio of 1:3. Fluorescent light-emission has been used in the conventional organic light-emitting elements, and the upper limit of the yields of light emission thereof was 25% in principle with respect to the number of excitons being generated. However, using phosphorescence generated from the triplet exciton, at least triple yield can be expected in principle. Furthermore, considering it together with transition from singlet excitation to triplet excitation which is energetically higher than the singlet excitation by means of inter system crossing, it is expected that the yield of light emission is 100% which is 4 times higher in principle.

The documents in which the light emission from the triplet excitation state is described include Japanese Patent Application Laid-Open No. 11-329739 (organic EL element and method for manufacturing the same), Japanese Patent Application Laid-Open No. 11-256148 (light-emitting material and organic EL element using the same), Japanese Patent Application Laid-Open No. 8-319482 (organic electroluminescent element), and so on.

As described above, the phosphorescent light-emitting materials have the possibilities of largely improving the efficiencies of the conventional organic EL elements. The same is applicable to the white-light-emitting EL element, and it is also considered that the phosphorescent light-emitting material is a promising material for increasing the efficiency of the white-light-emitting EL, so that the material is expected to realize a new white light source having luminous efficacy similar to that of fluorescent lamp.

However, when an organic light-emitting element for white light emission with a high efficiency is prepared using the phosphorescent light-emitting material as described above, a light emission color is shifted to red beyond expectation. Since it was used as a white light source, sufficient color purity could not be obtained or the like in some cases. This is not limited to the organic light-emitting element for white light emission. In the organic light-emitting element using a phosphorescent light-emitting material, a desired color purity could not be assured in some cases even though it is designed such that the light emission color becomes a specific color while selecting materials to be mixed.

DISCLOSURE OF THE INVENTION

The present invention has been made in consideration of the above problems and aims to realize a high-efficiency organic light-emitting element using a phosphorescent light-emitting material without decreasing a color purity of emitted light.

According to the present invention, there is provided an organic light-emitting element including at least one light-emitting layer between a pair of electrodes formed on a substrate and at least two or more light emission center materials included in the light-emitting layer, in which the at least one or more light emission center materials comprise a phosphorescent light-emitting material, and an excitation lifetime of the light emission center material that emits light having a shortest wavelength is shorter than an excitation lifetime of the other light emission center material.

BRIEF DESCRIPTION OF THE DRAWINGS

FIGS. 1A, 1B, and 1C are schematic cross-sectional views for illustrating configurations of organic light-emitting elements. FIG. 1A shows an organic compound layer having a two-layer configuration. FIG. 1B shows an organic compound layer having a three-layer configuration. FIG. 1C shows an organic compound layer having a four-layer configuration.

BEST MODE FOR CARRYING OUT THE INVENTION

Figure 2:
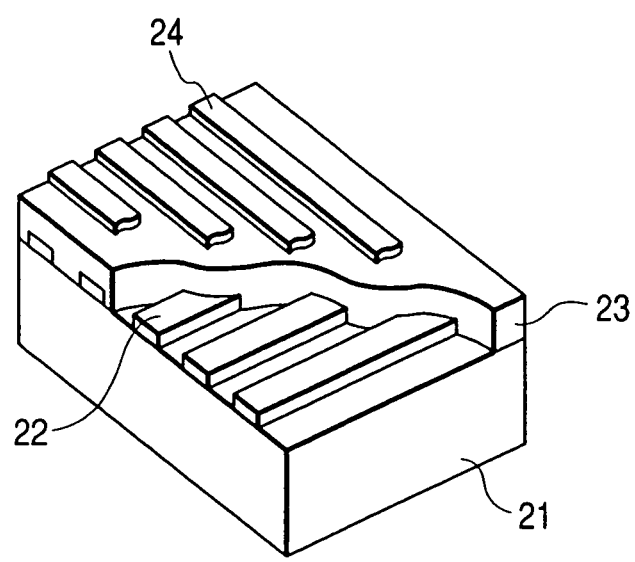
FIG. 2 is a partial perspective view for illustrating a schematic configuration of an XY-matrix display device.
Figure 3:
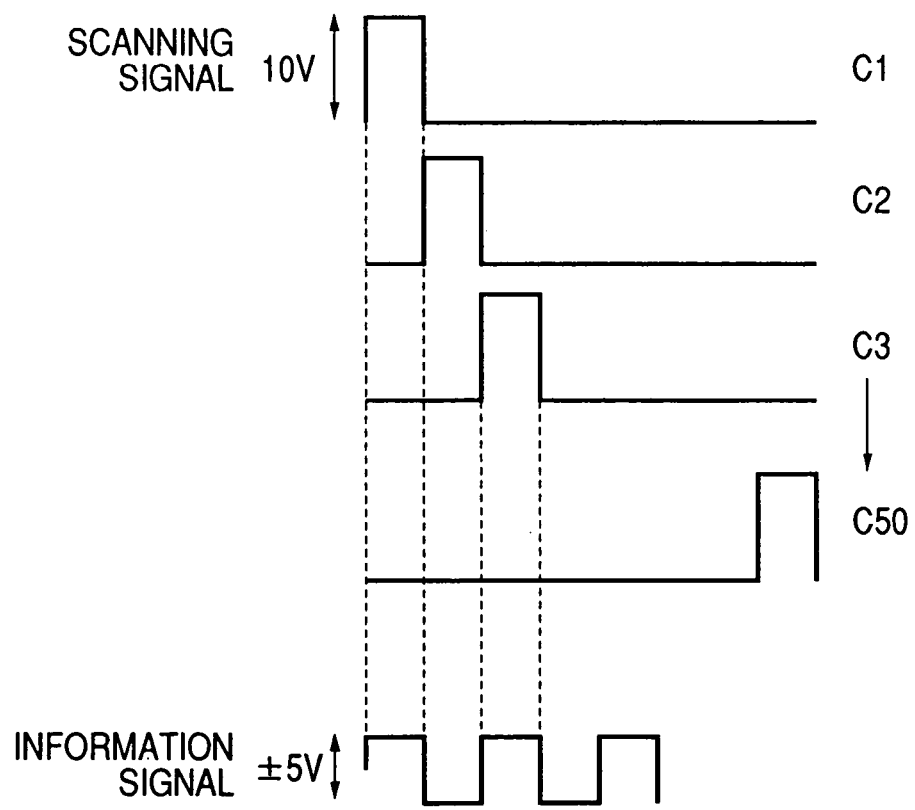
FIG. 3 is an explanatory view of an evaluation drive waveform.

The inventors of the present invention have made extensive studies, and as a result, it is found that a problem peculiar to a phosphorescent light-emitting material arises when an organic light-emitting element for white light emission is prepared using the phosphorescence light-emitting material as a pigment material.

For instance, in the case where a light-emitting layer is composed of a host material having a carrier-transporting property and a guest having a phosphorescent light emitting property, it is considered that the process from exciton generation to phosphorescent light emission may include several steps described below.

(a) Electron and hole transportation in the light-emitting layer, (b) Exciton generation of host (c) Excitation energy transmission between host molecules, (d) Excitation energy movement from host to guest, (e) Exciton generation of guest, (f) Excitation energy movement from guest to guest, and (g) Transition to base state from exciton of guest and light emission.

The desired energy movement and light emission in each of the steps are competitive reactions to various kinds of energy deactivation steps. Here, assuming the case in which a light-emitting layer for white light emission is constructed by a single layer and pigment materials of red (R), green (G), and blue (B) are doped in a host material, the movement of excitation energy between guests of the step (f) becomes very important for obtaining the desired white light emission.

For instance, considering the light emission wavelength of each of the pigment materials R, G, and B, the blue emitting material has the largest excitation energy, followed by the green emitting material and the red emitting material in that order. When the doping concentrations or the like of these pigment materials are not optimized, the energy movement from the pigment material having large excitation energy to the pigment material having small one is caused, so that the desired white color may not be obtained.

Furthermore, the studies of the inventors of the present invention have revealed the problem related to the excitation lifetime of each pigment material. In general, it is known that the lifetime of triplet exciton is longer than the lifetime of excited singlet exciton by three orders or more. According to studies of the inventors, in the case of preparing an organic light-emitting element for the white light emission using a phosphorescent light-emitting material, it has been found that some combination of the respective pigment materials substantially gives an effect on the color purity of white light emission.

As a result of those studies, according to a first aspect of the present invention, there is provided an organic light-emitting element comprising at least one light-emitting layer between a pair of electrodes formed on a substrate and at least two or more light emission center materials included in the light-emitting layer, characterized in that the at least one or more light emission center materials comprise a phosphorescent light-emitting material, and an excitation lifetime of the light emission center material that emits light having a shortest wavelength is shorter than an excitation lifetime of the other light emission center material.

According to the present invention, as another preferred aspect, in the invention according to the first aspect, "the light emission center material comprises a blue emitting material, a green emitting material, and a red emitting material, and an excitation lifetime $\tau B$ of the blue emitting material, the excitation lifetime $\tau G$ of the green emitting material, and the excitation lifetime $\tau R$ of the red emitting material satisfy a relationship represented by $\tau B < \tau R$ and $\tau B < \tau G$," and "the blue emitting material is a fluorescent light-emitting material, and the green emitting material and the red emitting material are phosphorescent light-emitting materials," and in addition, as another preferred aspect, "the light-emitting layer comprises a mixture of a monomer material and the light emission center material," or "the light-emitting layer comprises a mixture of a polymer material and the light emission center material."

In order to solve the above problems, according to a second aspect of the invention, there is provided a display device characterized by comprising the organic light-emitting element according to the first aspect of the invention, and drive means for driving the organic light-emitting element.

According to the present invention, as another preferred aspect of the invention, in the invention according to the second aspect, a switching element is formed on a substrate.

According to the studies of the inventors of the present invention, in the case of forming a white-light-emitting layer using a phosphorescent light-emitting material as a light emission center, in particular in the case where a blue emitting material is a phosphorescent light-emitting material, it has been found that light emission color tends to be changed from orange to red. The phenomenon may be caused due to the excitation lifetime of the blue phosphorescent light-emitting material equal to the excitation lifetime of the green or red emitting material, or longer than the excitation lifetime of the green or red emitting material.

Specifically, it is considered that green or red emitting materials being present around the blue emitting material deprive the excitation energy of the blue emitting material as the blue emitting material having the largest excitation energy (emitting the light with the shortest wavelength) is placed in a long-time excitation state. When the energy transfer occurs, the blue emitting material does not emit the light with a desired intensity. Therefore, it becomes difficult to obtain white light emission with a high purity as the balance of light-emission in a visible light region involves a bias to green or red.

Therefore, at the time of selecting a pigment material for attaining light emission of a desired color, the present invention realizes a high-efficient organic light-emitting element having an improved color purity of light emission by means of a material having the excitation lifetime of a light emission center material that emits light at the shortest wavelength, which is shorter than the excitation lifetime of other light emission center materials to prevent an undesired transition of excitation states from a higher excitation energy level to another lower excitation energy level.

In the embodiment using pigment materials of three primary colors RGB as described above, which are generally used for obtaining white light emission, a blue emitting material, a green emitting material, or a red emitting material may be used as a light emission center material and may be selected such that the relations of $\tau B < \tau R$ and $\tau B < \tau G$ are satisfied among the excitation lifetime $\tau B$ of the blue emitting material, the excitation lifetime $\tau G$ of the green emitting material, and the excitation lifetime $\tau R$ of the red emitting material.

For these pigment materials, metal coordination compounds having their respective central metal atoms such as Ir, Rh, Ru, Os, and Re are preferably used. Specifically, as a blue emitting material, Balq (excitation lifetime of 20 ns) which is a fluorescent light-emitting material represented by the following formula (2) as a typical example thereof, $Zn(BTZ)_2$ (excitation lifetime of 10 ns, represented by the following formula (4), or the like may be preferably used, and those having an excitation lifetime shorter than other pigment materials may be selected. As a green emitting material, $Ir(ppy)_3$ (excitation lifetime of 550 ns) which is a phosphorescent light-emitting material represented by formula (1) as a typical example thereof, $Ir(CH_3\text{-}ppy)_3$ (excitation lifetime of 500 ns) represented by the following formula (5), or the like may be preferably used, and those having an excitation lifetime longer than that of the blue emitting material may be selected. Furthermore, as a red emitting material, $Ir(piq)_3$ (excitation lifetime of 800 ns) which is a phosphorescent light-emitting material represented by the following formula (3) as a typical example thereof, $Ir(tiq)_3$ (excitation lifetime of 1100 ns) represented by the following formula (6), or the like may be preferably used, and those having an excitation lifetime longer than that of the blue emitting material may be selected.

(2)

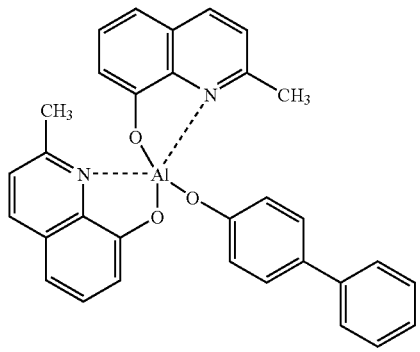

-continued

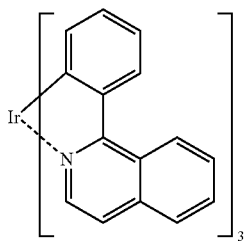
(3)

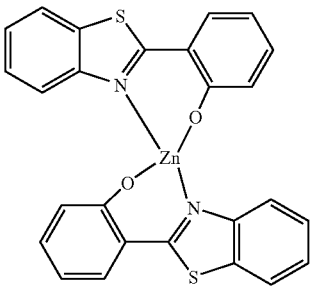
(4)

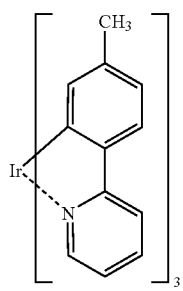
(5)

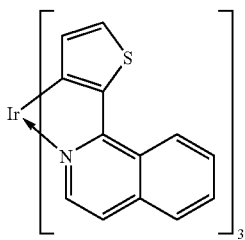
(6)

In the present invention, if the light-emitting layer satisfies the requirements described above, other configuration is not specifically limited. As a criterion at the time of selecting a material, however, a fluorescent light-emitting material is used as a blue emitting material and phosphorescent light-emitting materials are used as a green emitting material and a red emitting material. This is because, in general, the excitation lifetime of the fluorescent light-emitting material is shorter than that of the phosphorescent light-emitting material.

The host material of the light-emitting layer to be used in the present invention may-be either a monomer material or a polymer material but are not specifically limited. For instance, in the case of the monomer material, it is possible to form a thin film by a vacuum vapor deposition method using a compound serving as a host and each pigment material of RGB at desired concentrations. Specifically, it is preferable to use CBP: 4,4'-N,N'-dicarbazole-biphenyl represented by the above formula (1) or the like as a host. If the host material is a polymer material, it is possible to form a thin film by conducting a spin coating or inkjet method on a mixture obtained by mixing each pigment material of RGB in the host material at desired concentrations. Specifically, PVK (polyvinyl carbazole) represented by the following formula (7) or the like may be preferably used.

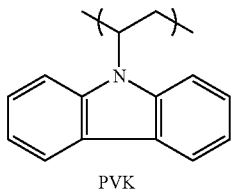
(7)

PVK

As a configuration of the present invention, although not limited to, each configuration exemplified in FIGS. 1A to 1C can be used. As a hole transporting material, α-NDP represented by formula (1) or the compound described below is preferably used.

1-TANTA: 4,4',4"-tris(1-naphthylphenylamino) triphenylamine,
2-TANTA: 4,4',4"-tris(2-naphtyl phenylamino) triphenylamine,
TCTA: 4,4',4"-tris(N-carbazoyl) triphenylamine
p-DPA-TDAB: 1,3,5-tris[N-(4-diphenylaminophenyl)phenylamino]benzene,
TDAB: 1,3,5-tris(diphenylamino) benzene,
TDTA: 4,4',4"-tris(diphenylamino) triphenylamine, and
TDAPB: 1,3,5-tris[(diphenylamino) phenyl]benzene.

In addition, as a material of electron-transporting layer to be used in an organic light-emitting element of the present invention, in addition to Alq3 represented by formula (1) or BCP, the following compound is preferably used.

BeBq: bis(benzo quinolinolate) beryllium complex,
DTVBi: 4,4'-bis-(2,2-di-p-tryl-vinyl)-biphenyl,
Eu(DBM)3(Phen): tris(1,3-diphenyl-1,3-propane diol) (monophenanthroline),
Eu (III), and
Bphen (bathophenanthroline).

Figure 4:
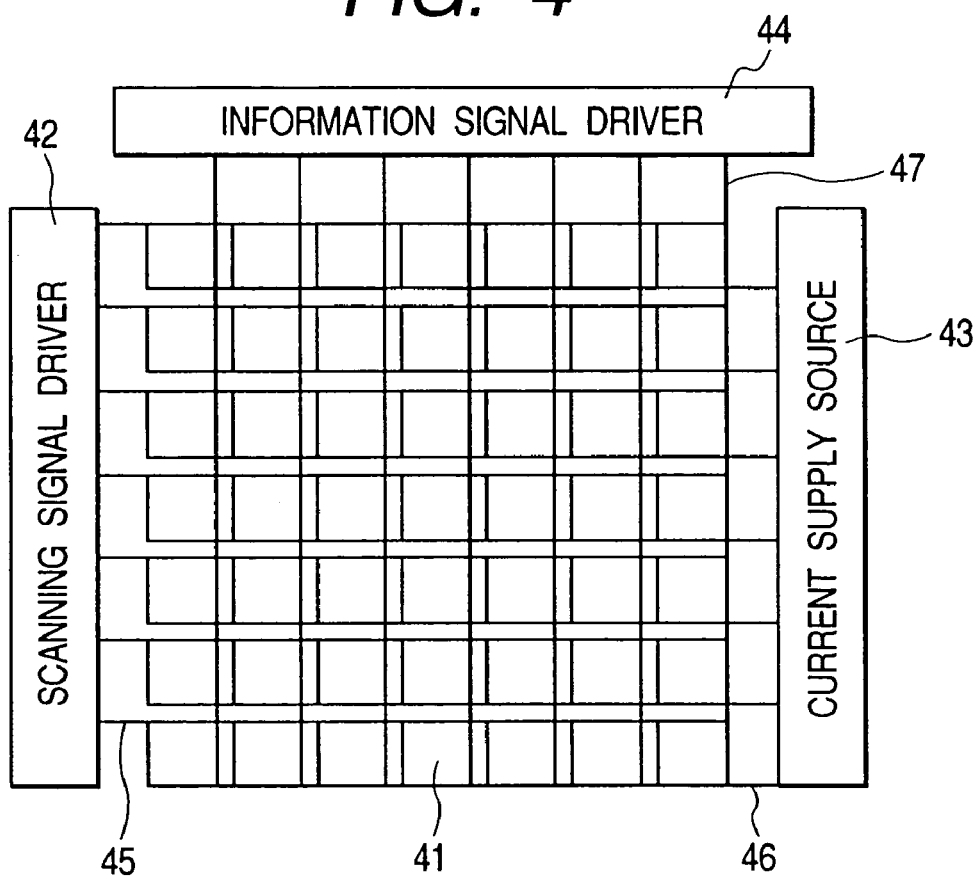
FIG. 4 is a schematic plan view of an active matrix display device using TFT.
Figure 5:
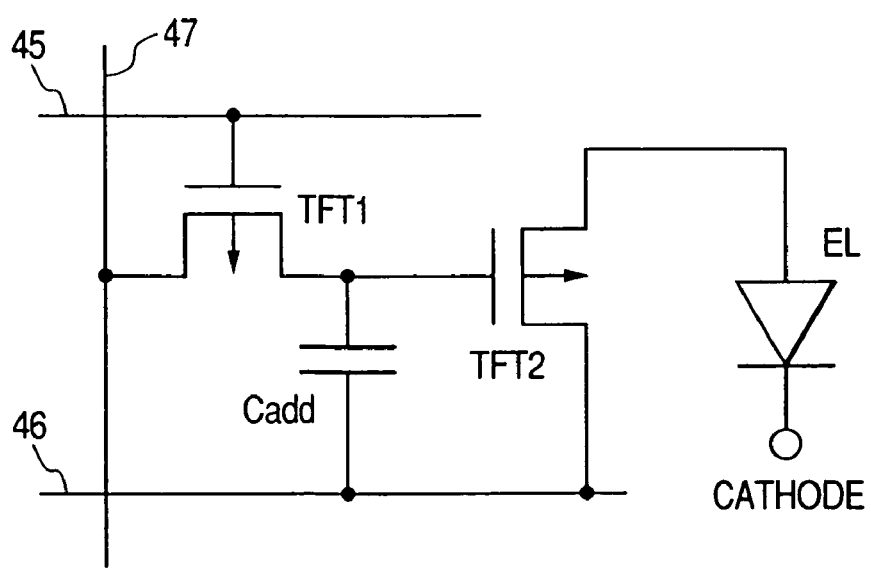
FIG. 5 is an equivalent circuit diagram of the periphery of a display pixel of the display device according to an embodiment shown in FIG. 4.
Figure 6:
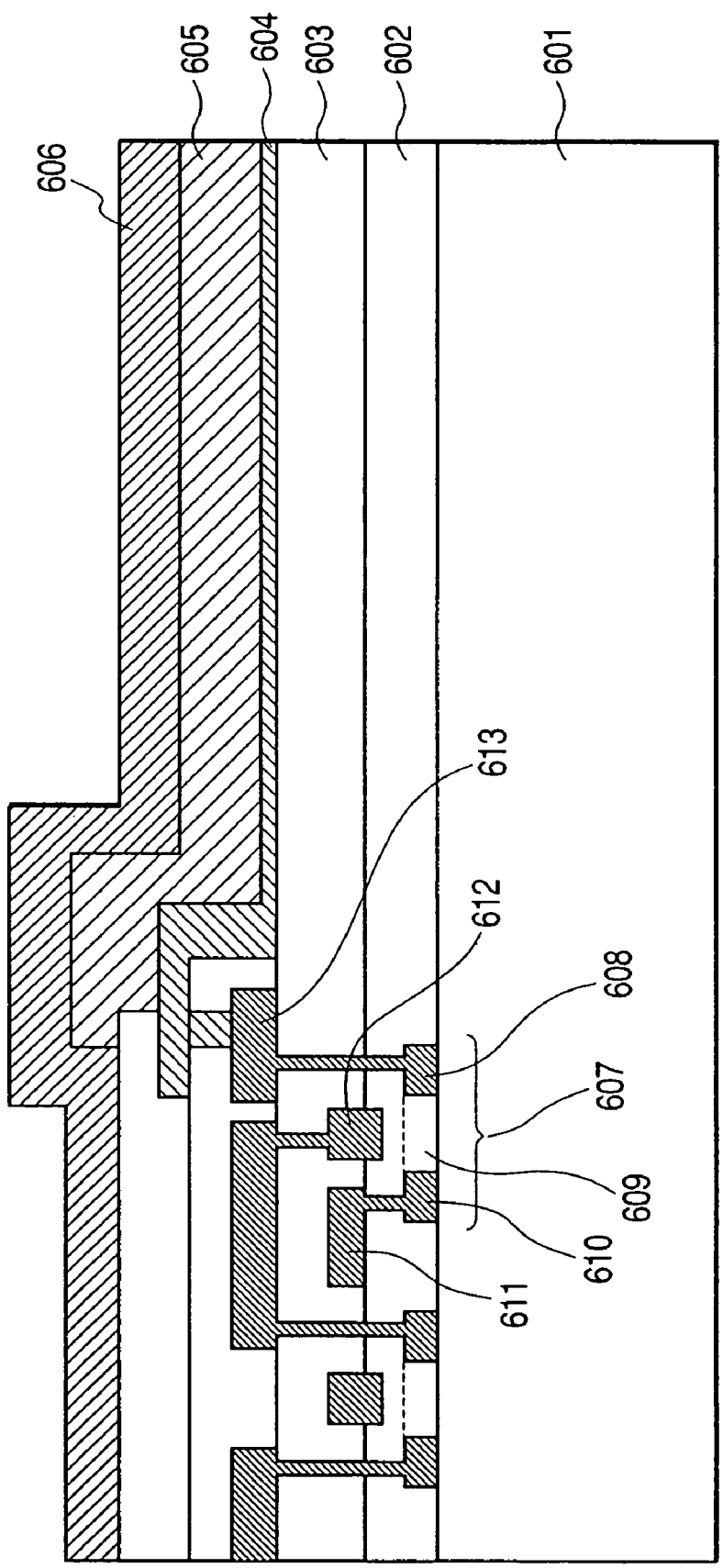
FIG. 6 is an explanatory view of the section of the display device according to the embodiment shown in FIG. 4.

A display device including the organic light-emitting element of the present invention as described above and drive means for driving the organic light-emitting element may be of a simple matrix type configured as shown in FIG. 2 (drive means is not shown) or an active matrix type as shown in FIGS. 4 to 6.

In FIG. 2, 21 denotes a glass substrate (base member), 22 denotes an ITO electrode, 23 denotes an organic compound layer including at least a light-emitting layer, and 24 denotes a cathode. In general, the cathode 24 is constructed of metal.

The ITO electrodes 22 and the cathodes 24, which are respectively formed in line are used as respective scanning lines or information lines and are brought into contact with the drive means for the well-known simple matrix display device, so that it can be used as a display device.

Furthermore, a higher-performance display device can be obtained by forming a switching element on the substrate to make an active matrix display device.

Hereinafter, an active matrix display device which is a preferred embodiment as a display device of the present invention will be described in more detail with reference to FIGS. 4 to 6.

FIG. 4 is a schematic plan view of an active matrix display device using TFT (switching element), FIG. 5 is an equivalent circuit diagram of the periphery of display pixel of the display device according to an embodiment shown in FIG.

4, and FIG. 6 is an explanatory view of the display device in cross section according to the embodiment shown in FIG. 4.

On the periphery of a display portion on which organic light-emitting elements are arranged, a drive circuit composed of a scanning signal driver 42 and a current supply source 43, and means for inputting a display signal as an information signal driver 44 (hereinafter, referred to as drive means) are arranged, which are brought into contact with an X-direction wiring referred to as a gate scanning line 45, a Y-direction wiring referred to as an information signal line 47, and a current supply line 46.

The scanning signal driver 42 selects gate signal lines 45 in sequence, while an image signal is applied from the information signal driver 44 in synchronization therewith. A display pixel 41 is arranged on an intersection of the gate scanning line 45 and the information signal line 47.

Next, using an equivalent circuit shown in FIG. 5, the operation of a pixel circuit will be described. Now, when a selection signal is applied on the gate scanning line 45, TFT1 is switched ON, a display signal is supplied from the information signal line 47 to a capacitor Cadd to determine a gate potential of TFT2. In the organic light-emitting element part (abbreviated as EL) arranged on each display pixel, current is supplied from the current supply line 46 depending on the gate potential of TFT2. The gate potential of TFT2 is kept by Cadd during the one frame period to thereby allow the current from the current supply line 46 to continuously flow into the EL during the period, so that it becomes possible to keep light emission during the one flame period.

As shown in FIG. 6, a polysilicon (Poly-Si layer) region 607 is formed on a glass substrate 601 (base member), and the desired impurities are doped in a drain region 608, a source region 610, and a channel region 609 sandwiched therebetween. A gate electrode 612 is formed thereon through a gate insulating film 602, while a drain electrode 613 and a source electrode 611 connected to the above drain region 608 and the source region 610 are formed. At this time, the drain electrode 613 and a transparent pixel electrode (ITO) are connected through a contact hole formed in the intervened insulating film 603. Note that, reference numeral 604 denotes an anode (ITO), and 605 denotes an organic light-emitting layer, and 606 denotes a cathode.

On the above pixel electrode (ITO), a multiple-layer or single-layer organic compound layer (the light-emitting layer) is formed, and subsequently the metal electrode provided as the cathode 606 is laminated to obtain an active matrix display device. Furthermore, the active matrix drive white-light-emitting display device according to the present invention and a color filter layer that is often used for the color liquid crystal display are combined together as appropriate to realize a color flat panel display with a simple process.

Consequently, using the organic light-emitting element according to the present invention, it becomes possible to provide a lightweight and energy-saving flat panel display or the like having a high visibility. In addition, as for a light source for a printer, the organic light-emitting elements of the present invention may be formed in line and utilized as a line shutter, where the elements are placed closer to a photosensitive drum and driven independently of one another, and then a predetermined exposure is performed on the photosensitive drum. On the other hand, the application to a lighting system and a backlight of a liquid crystal display device can be expected to achieve the energy-saving effects. In particular, as an embodiment for favorably applying the organic light-emitting element of the present invention to them, an organic light-emitting element for the white light emission can be given as an example, as is evident from the descriptions of prior art and the embodiment described above.

Hereinafter, the present invention will be described based on examples in detail.

EXAMPLE 1

In this example, an organic light-emitting element is prepared in accordance with the following configuration.

ITO/α-NPD (40 nm)/CBP (host material)+guest material (40 nm)/Bphen (50 nm)/KF (1 nm)/Al (100 nm)

An ITO film (about 70 nm) was formed on a non-alkali glass substrate (base member) having a thickness of 1.1 mm by means of a sputtering method, followed by using it as a transparent electrode on the anode side.

Then, α-NPD represented by formula (1) was deposited into a film having a thickness of 40 nm thereon as a hole-transporting layer by means of a vacuum vapor deposition method under the conditions in which the degree of vacuum is $8.0 \times 10^{-5}$ Pa.

Subsequently, CBP represented by formula (1) was provided as a host material and the following light emission center materials are prepared as guest materials by a co-vapor-deposition method to form a 40-nm thick film (under the conditions in which the degree of vacuum is $8.0 \times 10^{-5}$ Pa.

Blue emitting material: Fluorescent luminescence material Balq formula (2) (λmax=400 nm, an excitation lifetime of 20 ns), a concentration of 8 vol %.

Green emitting material: Phosphorescence luminescence material Ir(ppy)$_3$ formula (1) (λmax=515 nm, an excitation lifetime of 550 ns), a concentration of 2 vol %.

Red emitting material: Phosphorescence luminescence material Ir(piq)$_3$ formula (3), (λmax=623 nm, an excitation lifetime of 800 ns), a concentration of 0.5 vol %.

Next, Bphen (bathophenanthroline) (the following formula (8)) was deposited into a 40-nm thick film as an electron-transporting layer by means of a vacuum vapor deposition method under the conditions in which the degree of vacuum was $8.0 \times 10^{-5}$ Pa.

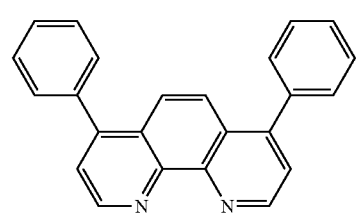

(8)

Then, potassium fluoride (KF) was deposited into a 1-nm thick film as an electron-injecting layer by means of a vacuum vapor deposition method under the conditions in which the degree of vacuum was $2.0 \times 10^{-4}$ Pa. At last, Al was deposited into a 100-nm thick film as a cathode material by the vacuum vapor deposition method under the conditions in which the degree of vacuum was $2.0 \times 10^{-4}$ Pa.

The organic light-emitting element prepared in this example was connected to a drive circuit and was then driven at a DC potential of 8 V, resulting in desired excellent white light emission.

COMPARATIVE EXAMPLE 1

In this example, an organic light-emitting element is prepared in accordance with the following configuration.

ITO/α-NPD (40 nm)/CBP (host material)+guest material (40 nm)/Bphen (50 nm)/KF (1 nm)/Al (100 nm)

The manufacturing process except that for the light-emitting layer is completely the same as that in Example 1.

The light-emitting layer is formed by using CBP represented by the formula (1) as a host material and the following light emission center materials as the guest materials by means of a co-vapor-deposition method to have a thickness of 40 nm (under the conditions in which the degree of vacuum is $8.0 \times 10^{-5}$ Pa).

Blue emitting material: Phosphorescence luminescence material having a structure represented by the following formula (9), ($\lambda$max=468 nm, an excitation lifetime of 20 ns), a concentration of 10 vol %.

Green emitting material: Phosphorescence luminescence material Ir(ppy)$_3$, ($\lambda$max=515 nm, an excitation lifetime of 550 ns), a concentration of 2 vol %.

Red emitting material: Phosphorescence luminescence material Ir(piq)$_3$ ($\lambda$max=623 nm, an excitation lifetime of 800 ns), a concentration of 0.5 vol %.

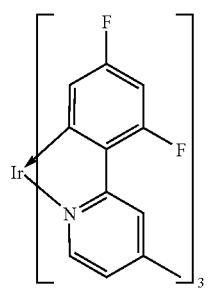

(9)

The organic light-emitting element prepared in this example was connected to a drive circuit and was then driven at a DC potential of 8 V. As a result, orange light emission was obtained regardless of the fact that the mixing ratio or the like of the pigment materials was determined on the condition of preparing an organic light-emitting element for the white light emission. This may be caused by a decrease in light-emission balance because excitation energy of the blue emitting material is transferred to the other pigment materials as the excitation lifetime of the phosphorescent light-emitting material being used as the blue emitting material is almost similar to the other pigment materials.

EXAMPLE 2

In this example, there is shown an example of manufacturing a display device of the present invention.

At first, XY-simple matrix organic light-emitting elements shown in FIG. 2 were prepared by the following procedures.

An ITO film having a thickness of about 100 nm was formed as a transparent electrode 22 (anode side) on a non-alkali glass substrate 21 having a length of 150 mm, a width of 150 mm, and a thickness of 1.1 mm by means of a sputtering method, followed by patterning 50 lines of electrodes at an interval: LINE/SPACE=100 μm/40 μm.

An organic compound layer and the like was laminated on the substrate having the above ITO electrode 22 to manufacture the device having the following configuration.

ITO/PVK (host material)+guest material (100 nm)/ KF (1 nm)/Al (150 nm)

The light-emitting layer was formed by dissolving the following light emission center material as a guest material into a chloroform solution of PVK formula (4) as a host material, by a spin-coating method to have a thickness of 100 nm.

Blue emitting material: Fluorescent luminescence material Balq formula (2), ($\lambda$max=400 nm, an excitation lifetime of 20 ns), a concentration of 6 vol %.

Green emitting material: Phosphorescence luminescence material Ir(ppy)$_3$ formula (1), ($\lambda$max=515 nm, an excitation lifetime of 550 ns), a concentration of 1 vol %.

Red emitting material: Phosphorescence luminescence material Ir(piq)$_3$ formula (3), ($\lambda$max=623 nm, an excitation lifetime of 800 ns), a concentration of 0.2 vol %.

Subsequently, potassium fluoride (KF) was deposited into a 1-nm thick film as an electron-injecting layer by means of a vacuum vapor deposition method under the conditions in which the degree of vacuum was $2.0 \times 10^{-4}$ Pa. At last, Al was deposited into a film to form 50 lines having a thickness of 100 nm as a cathode material by means of a mask vapor deposition under the conditions in which the degree of vacuum was $2.0 \times 10^{-4}$ Pa so as to intersect at right angles with the ITO electrodes 22 at an interval: LINE/SPACE=100 μm/40 μm.

The 50×50 simple matrix organic EL elements are connected to the drive means as a display device. Then, a simple matrix drive was carried out in a glove box filled with nitrogen atmosphere at a voltage of 5 to 15 volts by using scanning signals at 10 volts and information signals at ±5 volts. When it is driven in an interlaced manner at a frame frequency of 30 Hz, a black-and-white binary image was confirmed. In addition, a high color purity of white light emission was also confirmed.

The description has been made based on the embodiment and the examples as described above.

According to the present invention, a desired color light emission with high color purity can be obtained at a high efficiency while preventing an energy movement from a light emission center material having large excitation energy to another light emission center material in an organic light-emitting element using a phosphorescent light-emitting material as a light emission center material.

According to the present invention, furthermore, the application to a flat white light source with high color purity can be expected. In addition, a display device such as a full color display can be realized by a simple process with a combination of active element and color filter layer.

The invention claimed is:

1. An active matrix display device comprising:
   a plurality of organic light-emitting elements each comprising at least one light-emitting layer between a pair of electrodes formed on a substrate and at least two light emission center materials included in the light-emitting layer; and
   a thin film transistor for each of the organic light-emitting elements for driving the organic light-emitting elements, wherein at least one of the light emission center materials comprises a phosphorescent light-emitting material, and an excitation lifetime of the light emission center material that emits light having a shortest wavelength is shorter than an excitation lifetime of the other light emission center material, wherein the light emission center material comprises a blue emitting material, a green emitting material, and a red emitting material and an excitation lifetime τB of the blue emitting material, an excitation lifetime τG of the green emitting material, and an excitation lifetime τR of the red emitting material satisfy a relationship represented by τB<τR and τB<τG.

2. The display device as described in claim 1, wherein the blue emitting material is a fluorescent light-emitting material, and the green emitting material and the red emitting material are phosphorescent light-emitting materials.

3. An active matrix display device comprising:
a plurality of organic light-emitting elements each comprising at least one light-emitting layer between a pair of electrodes formed on a substrate and at least two light emission center materials included in the light-emitting layer; and
a thin film transistor for each of the organic light-emitting elements for driving the organic light-emitting elements, wherein at least one of the light emission center materials comprises a phosphorescent light-emitting material, and an excitation lifetime of the light emission center material that emits light having a shortest wavelength is shorter than an excitation lifetime of the other light emission center material, wherein the light emitting layer comprises a mixture of a monomer material and the light emission center materials.

* * * * *